US008583994B2

(12) United States Patent
Yamagishi

(10) Patent No.: US 8,583,994 B2
(45) Date of Patent: Nov. 12, 2013

(54) CODING APPARATUS AND METHOD FOR HANDLING QUASI-CYCLICAL CODES

(75) Inventor: Hiroyuki Yamagishi, Tokyo (JP)

(73) Assignee: Sony Corporation, Tokyo (JP)

( * ) Notice: Subject to any disclaimer, the term of this patent is extended or adjusted under 35 U.S.C. 154(b) by 533 days.

(21) Appl. No.: 12/546,199

(22) Filed: Aug. 24, 2009

(65) Prior Publication Data
US 2010/0058150 A1    Mar. 4, 2010

(30) Foreign Application Priority Data

Aug. 26, 2008 (JP) ................................ P2008-217004

(51) Int. Cl.
*H03M 13/00* (2006.01)
(52) U.S. Cl.
USPC ........................... 714/781; 714/758; 714/805
(58) Field of Classification Search
USPC ......................................... 714/758, 781, 805
See application file for complete search history.

(56) References Cited

U.S. PATENT DOCUMENTS

| | | | | |
|---|---|---|---|---|
| 5,443,212 A * | 8/1995 | Dinur | ............................ | 239/542 |
| 5,822,336 A * | 10/1998 | Weng et al. | .................. | 714/784 |
| 6,058,500 A * | 5/2000 | DesJardins et al. | ........... | 714/781 |
| 6,978,415 B1 * | 12/2005 | Weng | ............................ | 714/781 |
| 7,020,826 B2 * | 3/2006 | Litwin et al. | .................. | 714/784 |
| 7,617,439 B2 * | 11/2009 | Shen et al. | .................... | 714/784 |
| 7,617,442 B2 * | 11/2009 | Shen et al. | .................... | 714/801 |
| 7,711,763 B2 * | 5/2010 | Stribaek et al. | ............... | 708/492 |

FOREIGN PATENT DOCUMENTS

| | | |
|---|---|---|
| EP | 1580896 A2 | 9/2005 |
| JP | 2004-72130 | 3/2004 |
| JP | 2005-340920 | 12/2005 |
| JP | 2006-262002 | 9/2006 |
| JP | 4045872 | 11/2007 |
| JP | 2008-86008 | 4/2008 |

OTHER PUBLICATIONS

R. Gallager, "Low-Density Parity-Check Codes", IEEE Transactions on Information Theory, vol. IT-8, pp. 21-28 (1962).
Y. Kou et al., "Low-Density Parity-Check Codes Based on Finite Geometries: A Rediscovery and New Results", IEEE Transactions on Information Theory, vol. 47, No. 7, pp. 2711-2736 (2001).
M. Noda, "Designing a Self-orthogonal Quasi-cyclic Code with Extended Minimum Hamming Distance", Proc. $4^{th}$ Int. Sympo. Turbo Codes and Related Topics, 6 pages (2006).
R. Townsend et al., "Self-Orthogonal Quasi-Cyclic Codes", IEEE Trans. Inform. Theory. vol. IT-13, No. 2, pp. 183-195 (1967).
European Search Report from the European Patent Office in corresponding European Application No. 09251850.5, dated May 6, 2010.

(Continued)

*Primary Examiner* — Esaw Abraham
(74) *Attorney, Agent, or Firm* — Finnegan, Henderson, Farabow, Garrett & Dunner LLP

(57) ABSTRACT

Disclosed herein is a coding apparatus handling quasi-cyclic codes in which a given code word cyclically shifted by p symbols provides another code word, wherein parallel processing is executed in units of mp (a multiple of p) symbols; mp generator polynomials are used; and the generator polynomials $g_j(x)$ are selected such that a coefficient of degree $\deg(g_i(x))$ of x becomes zero for all $g_i(x)$ lower in degree than that and circuits in which these generator polynomials $g_j(x)$ are combined are connected with each other.

18 Claims, 9 Drawing Sheets

(56) References Cited

OTHER PUBLICATIONS

Zhixing Yang et al.,"A fast and efficient encoding structure for QC-LDPC codes" Communications, Circuits and Systems, 2008. ICCCAS 2008. International Conference On, IEEE, Piscataway, NJ, USA LNKD-DOI: 10.1109/ICCCAS. 2008.4657717, pp. 16-20, XP031352867 (May 25, 2008).

European Search Report dated Nov. 11, 2009, for corresponding European Application No. 09 25 1850.

Hiroyuki Yamagishi et al., "High Throughput Hardware Architecture for (1440, 1344) Low-Density Parity-Check Code Utilizing Quasi-Cyclic Structure," 2008 5th International Symposium on Turbo Codes and Related Topics, IEEE, ISBN: 978-1-4244-2863-2/08, XP031353666, pp. 78-83 (Sep. 1, 2008).

Zongwang Li et al., "Efficient Encoding of Quasi-Cyclic Low-Density Parity-Check Codes," Procedure Global Telecommunications Conference Globecom '05, IEEE, vol. 3, ISBN No. 10881390, XP-7803-9415-1/05, pp. 1205-1210 (Nov. 28, 2005).

Richard Townsend, et al., "Self-Orthogonal Quasi-Cyclic Codes," IEEE Transactions on Information Theory, vol. IT-13, No. 2, ISBN No. 2551439; pp. 183-195 (Apr. 1967).

* cited by examiner

FIG. 1
(PRIOR ART)

$$H = \begin{pmatrix} 1 & 0 & 0 & 0 & 0 & 1 & 0 & 0 & 0 & 1 & 1 & 0 \\ 1 & 0 & 1 & 0 & 0 & 0 & 0 & 1 & 0 & 0 & 0 & 1 \\ 0 & 1 & 1 & 0 & 1 & 0 & 0 & 0 & 0 & 1 & 0 & 0 \\ 0 & 0 & 0 & 1 & 1 & 0 & 1 & 0 & 0 & 0 & 0 & 1 \\ 0 & 1 & 0 & 0 & 0 & 1 & 1 & 0 & 1 & 0 & 0 & 0 \\ 0 & 0 & 0 & 1 & 0 & 0 & 0 & 1 & 1 & 0 & 1 & 0 \end{pmatrix}$$

FIG.6A

$$H = \begin{pmatrix} 0 & 0 & 0 & 0 & 1 \\ 0 & 0 & 0 & 1 & 0 \\ 0 & 0 & 1 & 0 & 0 \\ 0 & 1 & 0 & 0 & 0 \\ 1 & 0 & 0 & 0 & 0 \\ 1 & 1 & 0 & 0 & 1 \\ 0 & 1 & 0 & 1 & 0 \\ 1 & 0 & 1 & 1 & 1 \\ 1 & 0 & 0 & 0 & 1 \\ 1 & 0 & 1 & 1 & 0 \\ 0 & 1 & 1 & 1 & 0 \\ 1 & 0 & 0 & 1 & 0 \end{pmatrix}$$

FIG.6B

$$G = \begin{pmatrix} 0 & 0 & 0 & 1 & 1 & 0 & 1 \\ 1 & 1 & 1 & 0 & 1 & 1 & 0 \\ 0 & 1 & 1 & 0 & 1 & 0 & 0 \\ 0 & 1 & 0 & 0 & 0 & 1 & 1 \\ 1 & 0 & 1 & 1 & 1 & 0 & 1 \\ 0 & 0 & 0 & 0 & 0 & 0 & 1 \\ 0 & 0 & 0 & 0 & 0 & 1 & 0 \\ 0 & 0 & 0 & 0 & 1 & 0 & 0 \\ 0 & 0 & 0 & 1 & 0 & 0 & 0 \\ 0 & 0 & 1 & 0 & 0 & 0 & 0 \\ 0 & 1 & 0 & 0 & 0 & 0 & 0 \\ 1 & 0 & 0 & 0 & 0 & 0 & 0 \end{pmatrix}$$

FIG.7

$$G = \begin{pmatrix}
 & 1 & 2 & 3 & 4 & 5 & 6 & 7 & 8 & 9 & 10 & 11 & 12 \\
1 & 1 & 0 & 0 & 0 & 0 & 0 & 0 & 1 & 0 & 0 & 1 & 0 \\
2 & 0 & 1 & 0 & 0 & 0 & 0 & 0 & 0 & 1 & 1 & 1 & 0 \\
3 & 0 & 0 & 1 & 0 & 0 & 0 & 0 & 1 & 0 & 1 & 1 & 0 \\
4 & 0 & 0 & 0 & 1 & 0 & 0 & 0 & 1 & 0 & 0 & 0 & 1 \\
5 & 0 & 0 & 0 & 0 & 1 & 0 & 0 & 1 & 0 & 1 & 1 & 1 \\
6 & 0 & 0 & 0 & 0 & 0 & 1 & 0 & 0 & 1 & 0 & 1 & 0 \\
7 & 0 & 0 & 0 & 0 & 0 & 0 & 1 & 1 & 1 & 0 & 0 & 1
\end{pmatrix}
\begin{matrix}
\\ \\ \\ \rightarrow g_0(x) \\ \rightarrow g_3(x) \\ \rightarrow g_2(x) \\ \rightarrow g_1(x)
\end{matrix}$$

Columns 4–12 correspond to $x^8\ x^7\ x^6\ x^5\ x^4\ x^3\ x^2\ x^1\ x^0$

CODING APPARATUS AND METHOD FOR HANDLING QUASI-CYCLICAL CODES

BACKGROUND OF THE INVENTION

1. Field of the Invention

The present invention relates to a coding apparatus and method and, more particularly, to a coding apparatus and method that are configured to lower the processing load associated with coding and speed up the processing associated with coding.

2. Description of the Related Art

Recently, the LDPC (Low Density Parity Check) code (R. G. Gallager, "Low-density parity-check codes," IRE Trans. Inform. Theory, vol. IT-8, pp. 21-28, January 1962.) has been receiving attention as an error correction code. The LDPC code is advantageous in that code design is facilitated by providing a particular regularity to a parity check matrix of LDPC code and a circuit for coding and decoding by use of that regularity can be easily configured. Particularly, studies have been being made on many LDPC codes that uses the regularity having a cyclic structure. (For example, refer to Y. Kou, S. Lin, M. P. C. Fossorier, "Low-density parity-check codes based on finite geometries: a rediscovery and new results," IEEE Trans. Inform. Theory vol. 47, no. 7, pp. 2711-2736, November 2001. and M. Noda, "Designing a self-orthogonal quasi-cyclic code with extended minimum Hamming distance," Proc. 4th Int. Sympo. Turbo Codes and Related Topics, April 2006.)

A linear block code of length N=pL and information word length K in which each cyclic shift of a code word by p symbols yields another code word is referred to an (N, K) quasi-cyclic code. (For example, refer to R. L. Townsend and E. J. Weldon, Jr., "Self-orthogonal quasi-cyclic codes," IEEE Trans. Inform. Theory, vol. IT-13, no. 2, pp. 183-195, April 1967. (hereinafter referred to as Non-Patent Document 4)).

Referring to FIG. 1, there is shown an example of a parity check matrix of binary (12, 7) quasi-cyclic code. In the parity check matrix shown in FIG. 1, each sub matrix of 6-by-2 divided by lines is obtained by cyclically shifting down the immediately left-side sub matrix by one row. For example, "1 0" of row 1, column 1 and row 1, column 2 are shifted to row 2, column 3 and row 2, column 4 and "1 0" of row 2, column 1 and row 2, column 2 are shifted to row 3, column 3 and row 3, column 4. Thus, the sub matrix on the immediately left side is cyclically shifted down by one row.

Non-Patent Document 4 shows a configuration of a coding circuit that sequentially outputs parities from a K-stage cyclic shift register and two or more XOR circuits connected thereto. Japanese Patent No. 4045872 (herein after referred to as Patent Document 1) shows a method of the coding to systematic codes by repetitively using p generator polynomials as another coding method quasi-cyclic codes.

The coding method described in Patent Document 1 is based on the property that each code word is expressed by a sum of products of p generator polynomials having different orders and polynomials of $x^p$. Namely, given code polynomial $c(x)$ can be expressed by following equation (1):

$$c(x) = \sum_{j=1}^{p-1} g_j(x) q_j(x^p) \qquad (1)$$

In equation (1) above, $q_j(x^p)$ is a polynomial of $x^p$, $g_j(x)$ is a generator polynomial that is a code polynomial having minimum degree with the degree satisfying $\deg(g_j(x))$ mode $p=j$.

Let an information symbol row be $[a_0\ a_1\ \ldots\ a_{K-1}]$ and a parity symbol row be $[r_0\ r_1\ \ldots\ r_{N-K-1}]$ and define information polynomial $a(x)$ and parity polynomial $r(x)$ by the following equations, respectively:

$$a(x) = \sum_{j=0}^{K-1} a_j x^{K-1-j} \qquad (2)$$

$$r(x) = \sum_{j=0}^{N-K-1} r_j x^{N-K-1-j} \qquad (3)$$

At this time, systematic-coded symbol row $[a_0\ a_1\ \ldots\ a_{K-1}\ r_0\ r_1\ \ldots\ r_{N-K-1}]$ can be written as code polynomial $c(x)=a(x)$ $x^{N-K}r_{(x)}$. Therefore, for coding, a parity polynomial that satisfies equation (4) below may be obtained.

$$r(x) = a(x)x^{N-K} - \sum_{j=0}^{p-1} g_j(x) q_j(x^p) \qquad (4)$$

If a parity check matrix is the quasi-cyclic code shown in FIG. 1, the two generator polynomial may be:

$$g_0(x)=x^6+x^3+x$$

$$g_1(x)=x^5+x^4+x^3+1$$

FIG. 2 shows an exemplary configuration of a parity generating circuit that satisfies the above-mentioned two generator polynomials. The parity generating circuit 10 shown in FIG. 2 has input terminals 11, 12, flip-flops 13 through 17, output terminals 18, 19, AND circuits 20, 21, and adders 22 through 24.

With the parity generating circuit 10 shown in FIG. 2, information bits $a_1$, $a_3$, $a_5$, 0, 0, 0 are sequentially entered at the input terminal 11 and information bits $a_0$, $a_2$, $a_4$, $a_6$, 0, 0 are entered at the input terminal 12. From the output terminal 18, parity bits $r_0$, $r_2$, $r_4$ are sequentially outputted and, from the output terminal 19, parity bits $r_1$, $r_3$ are sequentially outputted.

Before executing coding, the parity generating circuit 10 initializes all flip-flops 13 through 17 to zero. The information bits are entered in units of two bits with 0 added by the number of parities, during which a control signal is kept at 1.

When the information bits have all been entered in the parity generating circuit 10, the parities are sequentially outputted to the flip-flops 13 through 17, with the control signal being 0. In the feedback from the upper bits of the flip-flops 13 through 17, the coefficient of the generator polynomial corresponds to the place of 1.

FIG. 3 schematically shows a parity generating circuit configured to execute parallel processing on a p symbol basis. FIG. 3 also schematically shows the parity generating circuit 10 shown in FIG. 2. A parity generating circuit 50 shown in FIG. 3 is configured by an (N−K)-stage register 51 and a combinatorial circuit 52.

The combinatorial circuit 52 of the parity generating circuit 50 shown in FIG. 3 is configured to obtain coefficients of sequential $q_j(x^p)$ from upper p symbols of the (N−K)-stage register 51 and subtract a value obtained by multiplying these p coefficients by the generator polynomial from a register output and new p information symbols, thereby using a subtraction result for a next register input value.

In order to executing coding at higher speeds in the parity generating circuit 50 configured by the above-mentioned one-stage combinatorial circuit 52, the operation clock of the circuit may be increased as one means. However, it is systematically difficult to increase the operation clock higher than 400 MHz for example.

Therefore, in order to executing coding at high speeds, a configuration may be considered in which parallel processing is executed in units of symbols that is a multiple of p. For example, a coding circuit for executing parallel processing in units of 2p symbols can be realized by stacking two parity generating circuits that execute the processing on a p symbol unit as shown in FIG. 2.

FIG. 4 shows a parity generating circuit 100 that executes, in units of 4 bits, parallel processing of the 2-stage of the combinatorial circuit in the parity generating circuit 10 shown in FIG. 2. The parity generating circuit 100 shown in FIG. 4 is configured by input terminals 101 through 104, flip-flops 105 through 109, output terminals 110 through 113, AND circuits 114 through 117, and adders 118 through 127.

With the parity generating circuit 100 shown in FIG. 4, information bits $a_3$, 0, 0 are sequentially entered at the input terminal 101, information bits $a_0$, $a_4$, 0 are sequentially entered at the input terminal 102, information bits $a_1$, $a_5$, 0 are sequentially entered at the input terminal 103, and information bits $a_2$, $a_6$, 0 are sequentially entered at the input terminal 104. Parity bits $r_0$, $r_4$ are outputted from the output terminal 110, parity bit $r_1$ is outputted from the output terminal 111, parity bit $r_2$ is outputted from the output terminal 112, and parity bit $r_3$ is outputted from the output terminal 113.

Before executing coding, the parity generating circuit 100 initializes all flip-flops 105 through 109 to 0. The information bits are entered in units of four bits with 0 added by the number of parities, during which a control signal is kept at 1.

When the information bits have all been entered in the parity generating circuit 100, the parities are sequentially outputted to the flip-flops 105 through 109, with the control signal being 0.

FIG. 5 schematically shows a parity generating circuit 150 that executes, in units of 2p symbols, parallel processing of the 2-stage of the combinatorial circuit 52 in the parity generating circuit 50 shown in FIG. 3 using p generator polynomials. The parity generating circuit 150 shown in FIG. 5 is configured by an (N−K)-stage register 151, a combinatorial circuit 152, and a combinatorial circuit 153.

The two connected combinatorial circuits 152 and 153 are the same in configuration as the combinatorial circuit 52 shown in FIG. 3. The first-stage combinatorial circuit 152 obtains coefficients of sequential $q_j(x_p)$ from the upper p symbols of the (N−K)-stage register 151. The second-stage combinatorial circuit 153 obtains coefficients of sequential $q_j(x^p)$ from the upper p symbols in the output from the first-stage combinatorial circuit 152.

Therefore, after the upper p symbols of a result of the subtraction of a value obtained by multiplying p coefficients and generator polynomials in the first-stage combinatorial circuit 152 from the register output have been established, a multiplication is further executed between the second-stage p coefficients and generator polynomials. Because the second-stage operation is started by use of a result of the first-stage operation, a delay is caused by the wait for the result of operation of the first stage, thereby eventually causing a large delay.

SUMMARY OF THE INVENTION

As described above, an increase in coding speed may demand an increase in the operation clock of the circuit. However, it is difficult in circuit configuration to increase the operation clock of the circuit. To overcome this problem, a method may be considered in which parallel processing is executed in units of symbols of a multiple of p (processing is executed as a configuration of multiple stages). However, in this configuration, the processing of the succeeding stage is executed after the processing of the preceding stage, so that, as the number of stages increases, the resultant delays are accumulated, thereby making it difficult to speed up the processing.

Therefore, the present embodiment addresses the above-identified and other problems associated with related-art methods and apparatuses and solves the addressed problems by providing a coding apparatus and method that are able to speed up the processing of coding.

In carrying out an embodiment of the present invention, there is provided a coding apparatus handling quasi-cyclic codes in which a given code word cyclically shifted by p symbols provides another code word. In this coding apparatus, parallel processing is executed in units of mp (a multiple of p) symbols; mp generator polynomials are used; and the generator polynomials $g_j(x)$ are selected such that a coefficient of degree $\deg(g_i(x))$ of x becomes zero for all $g_i(x)$ lower in degree than that and circuits in which these generator polynomials $g_j(x)$ are combined are connected with each other.

In the above-mentioned coding apparatus, the circuits in which the generator polynomials $g_j(x)$ are combined are connected such that higher degrees of the generator polynomials do not overlap each other in each of the generator polynomials.

In carrying out another embodiment of the present invention, there is provided a coding method for a coding apparatus handling quasi-cyclic codes in which a given code word cyclically shifted by p symbols provides another code word. In the above-mentioned coding method, parallel processing is executed in units of mp (a multiple of p) symbols; mp generator polynomials are used; and the generator polynomials $g_j(x)$ are selected such that a coefficient of degree $\deg(g_i(x))$ of x becomes zero for all $g_i(x)$ lower in degree than that and coding is executed in circuits in which circuits in which these generator polynomials $g_j(x)$ are combined are connected with each other.

In the above-mentioned coding apparatus and coding method, in coding a quasi-cyclic code in which a given code word cyclically shifted by p symbols provides another code word, parallel processing is executed in units of mp (a multiple of p), mp generator polynomials are used, generator polynomials $g_j(x)$ are selected such that a coefficient of degree $\deg(g_i(x))$ of x becomes zero for all $g_i(x)$ lower in degree than that, and circuits in which these generator polynomials $g_j(x)$ are combined are connected with each other.

In carrying out still another embodiment of the present invention, there is provided a coding apparatus. In this coding apparatus, coefficients of $g_j(x^{mp})$ that is a polynomial of $x^{mp}$ are sequentially obtained from upper mp symbols of an (N−K)-stage register and a value to be generated by subtracting a value obtained by multiplying these mp coefficients by a generator polynomial from a value made up of a register output and new mp information symbols is used for a next register input value and the $g_j(x^{mp})$ coefficients are supplied to combinatorial circuits of a plurality of stages.

In carrying out yet another embodiment of the present invention, there is provided a coding method for a coding apparatus in an (N, K) quasi-cyclic code. In this coding method, coefficients of $q_j(x^{mp})$ that is a polynomial of $x^{mp}$ are sequentially obtained from upper mp symbols of an (N–K)-stage register and a value to be generated by subtracting a value obtained by multiplying these mp coefficients by a generator polynomial from a value made up of a register output and new mp information symbols is used for a next register input value and the $q_j(x_{mp})$ coefficients are supplied to combinatorial circuits of a plurality of stages.

In the above-mentioned coding apparatus and coding method, coding in an (N, K) quasi-cyclic code is executed, coefficients of $q_j(x^{mp})$ that is a polynomial of $x^{mp}$ are sequentially obtained from upper mp symbols of an (N–K)-stage register, a value obtained by multiplying these mp coefficients by a generator polynomial is subtracted from a value made up of a register output and new mp information symbols, a value generated as a result of the subtraction is used for a next register input value, and the coefficients of $q_j(x^{mp})$ are supplied to the combinatorial circuits of a plurality of stages.

According to an embodiment of the present invention, the speed of the processing associated with coding can be increased.

BRIEF DESCRIPTION OF THE DRAWINGS

FIG. 1 is a diagram illustrating a known parity check matrix;

FIGS. 6A and 6B are diagrams for explaining the selection of generator polynomials;

FIG. 7 is a diagram for explaining the selection of generator polynomials;

DETAILED DESCRIPTION OF THE PREFERRED EMBODIMENTS

This embodiment will be described in further detail by way of embodiments thereof with reference to the accompanying drawings.

Embodiments of the present invention relate to a coding apparatus. Before describing the configuration of the coding apparatus associated with embodiments of the present invention, the coding associated with embodiments of the present invention will be described.

An (N, K) quasi-cyclic code in which a given code word which is cyclically shifted by p symbols provides another code word has a property that a given code word cyclically shifted by mp symbols also provides a code word, m being an integer. Consequently, code polynomial c(x) may be expressed by equation (5) below by use of mp generator polynomials.

$$c(x) = \sum_{j=0}^{mp-1} g_j(x) q_j(x^{mp}) \quad (5)$$

In equation (5) above, $q_j(x^{mp})$ is a polynomial of $x^{mp}$ and $g_j(x)$ is a code polynomial having the minimum degree with the degree satisfying $\deg(g_j(x)) \bmod mp = j$. Here, $g_j(x)$ is written as a generator polynomial. Thus defined, the coding of a quasi-cyclic code can be executed by obtaining a parity polynomial satisfying. equation (6) below.

$$r(x) = a(x)x^{N-K} - \sum_{j=0}^{mp-1} g_j(x) q_j(x^{mp}) \quad (6)$$

Especially, in the selection of a generator polynomial, $g_j(x)$ is selected such that the coefficient of degree $\deg(g_t(x))$ of x becomes 0 for all $g_t(x)$ having degrees lower than that. For example, if a parity check matrix is quasi-cyclic codes shown in FIG. 1 and m=2, the four generator polynomials are selected as follows:

$g_0(x) = x^8 + x^4 + 1$ $g_1(x) = x^5 + x^4 + x^3 + 1$ $g_2(x) = X^6 + x^3 + x$ $g_3(x) = x^7 + x^4 + x^2 + x + 1$

These generator polynomials provide equation (7).

Figure 8:
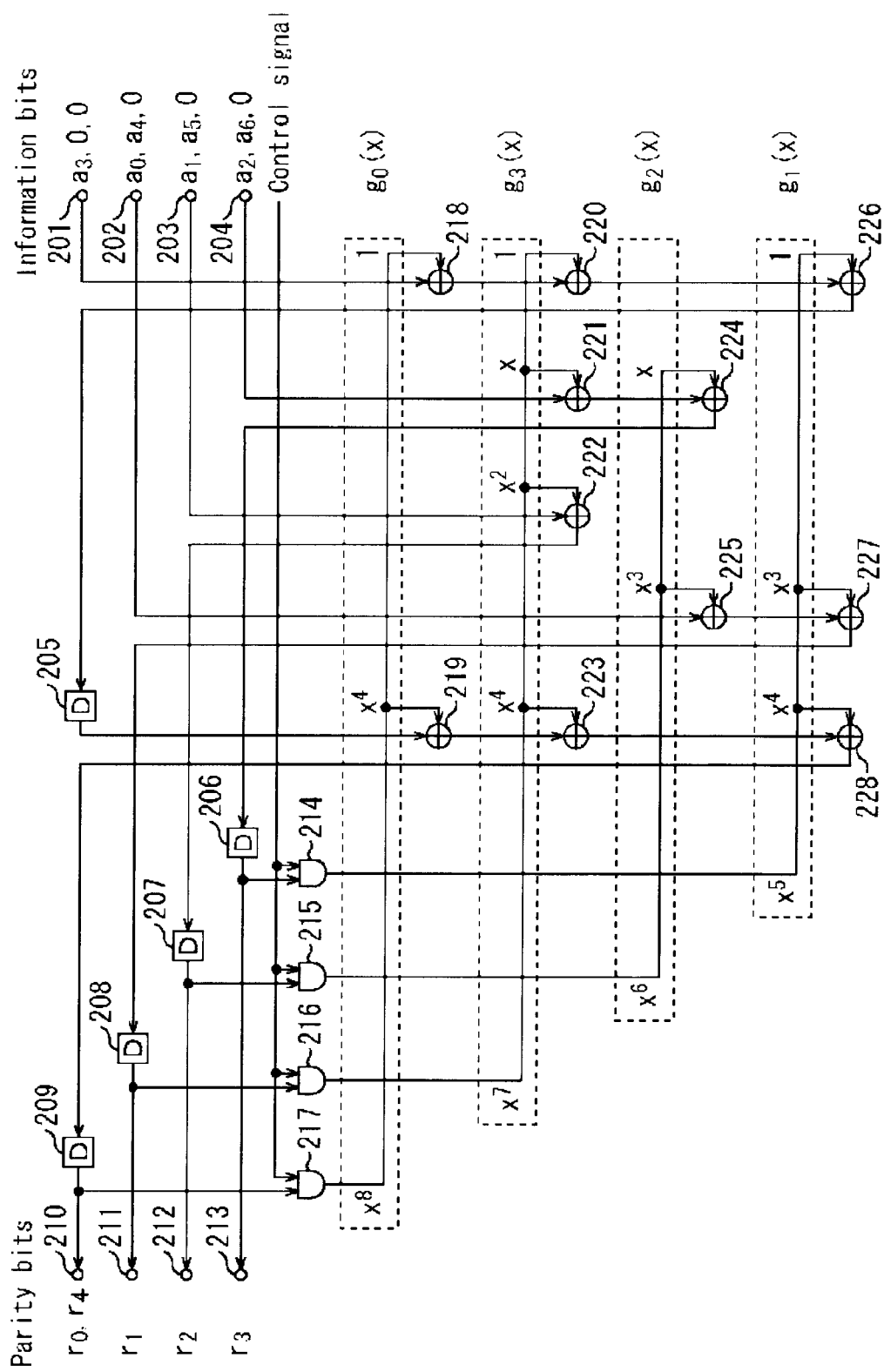
FIG. 8 a circuit diagram illustrating an exemplary configuration of a parity generating circuit practiced as one embodiment of the invention.

$g_0(x)$ of this generator polynomial does not include terms $x^7$, $x^6$, $x^5$, $g_3(x)$ does not include terms $x^6$, $x^5$, and $g_2(x)$ does not include term $x^5$. Considering this, a parity generating circuit as shown in FIG. 8 may be configured. Before describing this parity generating circuit, a method of selecting the above-mentioned four generator polynomials will be explained.

As described above, equation (7) above is derived when m=2 in a quasi-cyclic code with a parity check matrix expressed by FIG. 1. Executing a row basic deformation on the parity check matrix shown in FIG. 1 provides matrix H' shown in FIG. 6A. Paying attention to this matrix H' indicates that the right-side partial matrix (the partial matrix to the right of the vertical line shown in FIG. 6A) is a unit matrix. Further, executing deformation such as transposition for example on the partial matrix to the left of the vertical line shown in FIG. 6A provides matrix G such as shown in FIG. 6B. Matrix G is generally called a generator matrix.

Paying attention to matrix G shown in FIG. 6B indicates that the partial matrix to the left side (the partial matrix to the left side of the vertical line shown in FIG. 6B) is a unit matrix. From such matrix G, a generator polynomial can be selected. A relation between matrix G and generator polynomial is as shown in FIG. 7. For the convenience of description, row numbers and column numbers are given to matrix G in FIG. 7.

Each column is indicative of a degree configuring a generator polynomial. For example, each element of column 12 is equivalent to degree 0 ($x^0$) configuring the generator polynomial, each element of column 11 is equivalent to degree 1 ($x^1$) configuring the generator polynomial, each element of column 10 is equivalent to degree 2 ($x^2$) configuring the generator polynomial, ..., and each element of column 4 is equivalent to degree 8 ($x^8$) configuring the generator polynomial.

Here, let row 7 be $g_1(x)$ of the generator polynomial, then only terms with element value being 1 remain, so that generator polynomial $g_1(x)$ is configured by degree $0(x^0=1)$ that is the element of column 12, degree $3(x^3)$ that is the element of column 9, degree $4(x^4)$ that is the element of column 8, and degree $5(x^5)$ that is the element of column 7. Therefore, generator polynomial $g_1(x)$ becomes generator polynomial $g_1(x)=x^5+x^4+x^3+1$.

Likewise, let row 6 be $g_2(x)$ of the generator polynomial, then generator polynomial $g_2(x)$ is configured by degree $1(x^1=x)$ that is the element of column 11, degree $3(x^3)$ that is the element of column 9, and degree $6(x^6)$ that is the element of column 6. Therefore, generator polynomial $g_2(x)$ becomes generator polynomial $g_2(x)=x^6+x^3+x$.

Likewise, let row 5 be $g_3(x)$ of the generator polynomial, then generator polynomial $g_3(x)$ is configured by degree $0(x^6=1)$ that is the element of column 12, degree $1(x^1=x)$ that is the element of column 11, degree $2(x^2)$ that is the element of column 10, degree $4(x^4)$ that is the element of column 8, and degree $7(x^7)$ that is the element of column 5. Therefore, generator polynomial $g_3(x)$ becomes generator polynomial $g_3(x)=x^7+x^4+x^2+x+1$.

Likewise, let row 4 be $g_0(x)$ of the generator polynomial, then generator polynomial $g_0(x)$ is configured by degree $0(x^0=1)$ that is the element of column 12, degree $4(x^4)$ that is the element of column 8, and degree $8(x^8)$ that is the element of column 4. Therefore, generator polynomial $g_0(x)$ becomes generator polynomial $g_0(x)=x^8+x^4+1$.

Thus, generator polynomials can be selected from matrix G with parity check matrix deformed. Namely, in the selection of generator polynomials, $g_j(x)$ is selected such that the coefficient of degree $\deg(g_j(x))$ of x becomes zero for all $g_j(x)$ lower in degree than that.

Also, making the partial matrix to the left of matrix G be a unit matrix can prevent the overlapped use of higher degrees (5 through 8) in each generator polynomial, thereby enabling to configure the parity generating circuit as shown in FIG. 8, eventually speeding up the coding processing.

FIG. 8 shows the configuration of the parity generating circuit for executing parallel processing on a 4-bit basis with m=2 on the basis of the generator polynomials of equation (7). A parity generating circuit shown in FIG. 8 is configured by input terminals 201 through 204, flip-flops 205 through 209, output terminals through 213, AND circuits 214 through 217, and adders through 228.

Before executing coding, the parity generating circuit 200 initializes all flip-flops 205 through 209 to 0. The information bits are entered in units of four bits with 0 added by the number of parities, during which a control signal is kept at 1.

When the information bits have all been entered in the parity generating circuit 200, the parities are sequentially outputted to the flip-flops 205 through 209, with the control signal being 0. In the feedback from the upper bits of the flip-flops 205 through 209, the coefficient of the generator polynomial corresponds to the place of 1. This is because, as described above with reference to FIG. 6 and FIG. 7, the generator polynomials (7) were selected from matrix G.

In the parity generating circuit 200 shown in FIG. 8, information bits $a_3$, 0, 0 are sequentially entered at the input terminal 201, information bits $a_0$, $a_4$, 0 are sequentially entered at the input terminal 202, information bits $a_1$, $a_5$, 0 are sequentially entered at the input terminal 203, and information bits $a_2$, $a_6$, 0 are sequentially entered at the input terminal 204. Parity bits $r_0$ and $r_4$ are sequentially outputted from the output terminal 210, parity bits $r_1$ is outputted from the output terminal 211, parity bit $r_2$ is outputted from the output terminal 212, and parity bit $r_3$ is outputted from the output terminal 213.

A connection relation of the parity generating circuit 200 shown in FIG. 8 is as follows. The input terminal 201 supplies data to the adder 218. Data from the AND circuit 217 is also supplied to the adder 218. The adder 218 adds the data from the AND circuit 217 and the data from the input terminal 201 and outputs a result to the adder 220. The data from the AND circuit 216 is also supplied to the adder 220. The adder 220 adds the data from the AND circuit 216 and the data from the adder 218 and outputs a result to the adder 226. The data from the AND circuit 214 is also supplied to the adder 226. The adder 226 adds the data from the AND circuit 214 and the data from the adder 220 and supplies a result to the flip-flop 205.

The input terminal 202 supplies data to the adder 225. The data from the AND circuit 215 is also supplied to the adder 225. The adder 225 adds the data from the AND circuit 215 and the data from the input terminal 202 and outputs a result to the adder 227. The data from the input circuit 214 is also supplied to the adder 227. The adder 227 adds the data from the AND circuit 214 and the data from the adder 225 and supplies a result to the flip-flop 208.

The input terminal 203 supplies data to the adder 222. The data from the AND circuit 216 is also supplied to the adder 222. The adder 222 adds the data from the AND circuit 216 and the data from the input terminal 203 and outputs a result to the flip-flop 207.

The input terminal 204 supplies data to the adder 221. The data from the AND circuit 216 is also supplied to the adder 221. The adder 221 adds the data from the AND circuit 216 and the data from the input terminal 204 and supplies a result to the adder 224. The data from the AND circuit 215 is also supplied to the adder 224. The adder 224 adds the data from the AND circuit 215 and the data from the adder 221 and supplies a result to the flip-flop 206.

The output from the flip-flop 205 is entered in the adder 219. The data from the AND circuit 217 is also supplied to the adder 219. The adder 219 adds the data from the AND circuit 217 and the data from the flip-flop 205 and outputs a result to the adder 223. The data from the adder 216 is also supplied to the adder 223. The adder 223 adds the data from the AND circuit 216 and the data from the adder 219 and output a result to the adder 228. The data from the AND circuit 214 is also supplied to the adder 228. The adder 228 adds the data from the AND circuit 214 and the data from the adder 223 and outputs a result to the flip-flop 209. The output from the flip-flop 209 is outputted as a parity bit and supplied to the AND circuit 217.

The output from the flip-flop 208 is outputted as a parity bit and supplied to the AND circuit 216. The output from the flip-flop 207 is outputted as a parity bit and supplied to the AND circuit 215. The output from the flip-flop 206 is outputted as a parity bit and supplied to the AND circuit 214.

A control signal is supplied to the AND circuits 214 through 217, which output data with predetermined timings corresponding to the control signal. Namely, the AND circuit 214 outputs data to the adders 226 through 228, the AND circuit 215 output data to the adder 224 and the adder 225, the AND circuit 216 outputs data to the adders 220 through 223, and the AND circuit 217 outputs data to the adder 218 and the adder 219.

The above-mentioned novel configuration allows the reduction in delay. This will be described again with reference to FIG. 8. In FIG. 8, the portions enclosed by dashed lines are indicative of portions in which operations are executed on generator polynomials. The portions enclosed by dashed lines are denoted by a first stage, a second stage, a third stage, and a fourth stage from top to down in FIG. 8.

The first stage corresponds to an operation of generator polynomial $g_0(x)$, the second stage corresponds to an operation of generator polynomial $g_3(x)$, the third stage corresponds to an operation of generator polynomial $g_2(x)$, and the fourth stage corresponds to an operation of generator polynomial $g_1(x)$. The parity generating circuit 200 shown in FIG. 8 is configured to be able to simultaneously get the outputs from the AND circuits 214 through 217 necessary for the computation of the generator polynomial of each stage. Consequently, the above-mentioned novel configuration allows the realization of parity generation with the delay time minimized.

Figure 2:
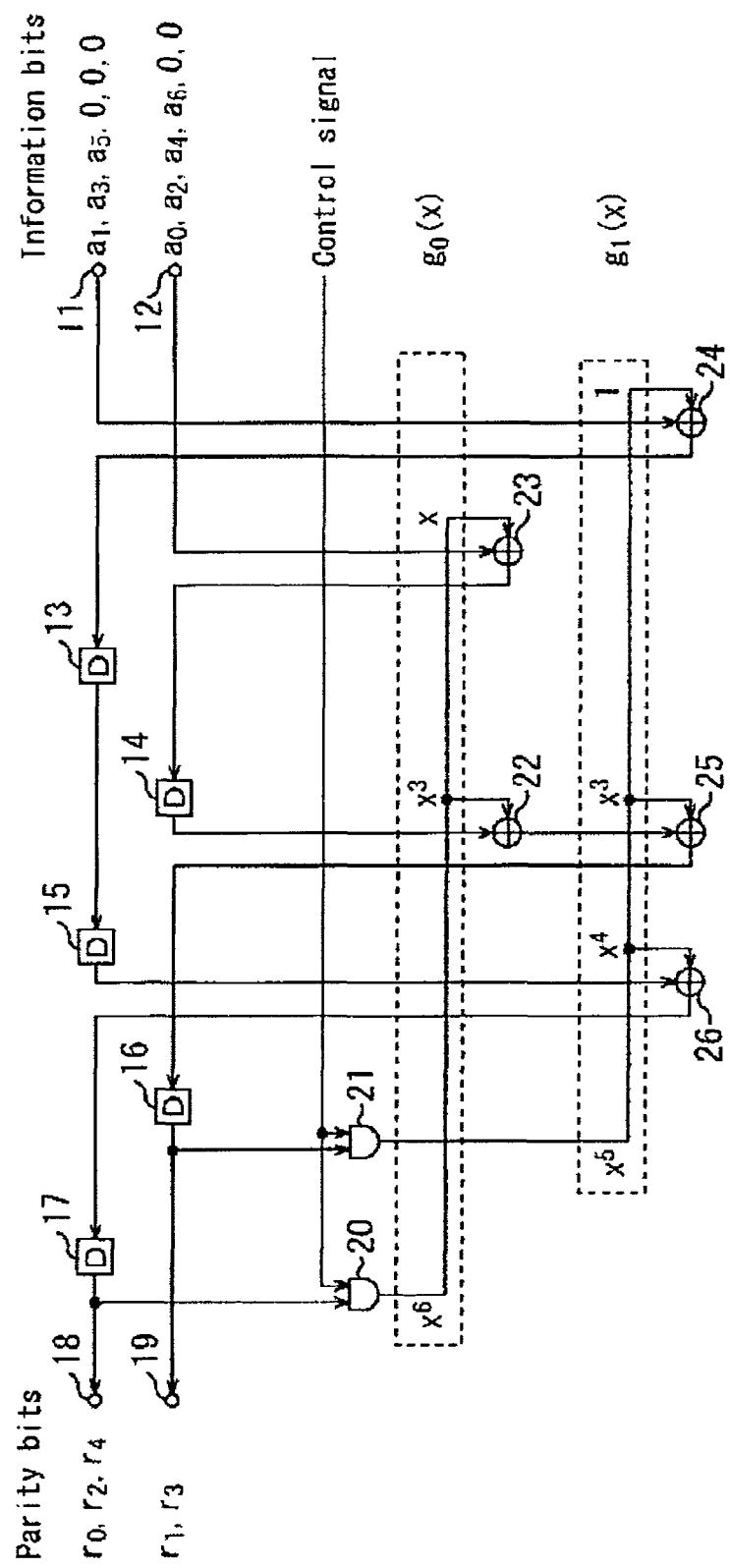
FIG. 2 is a circuit diagram illustrating an exemplary known configuration of a related-art parity generating circuit.
Figure 3:
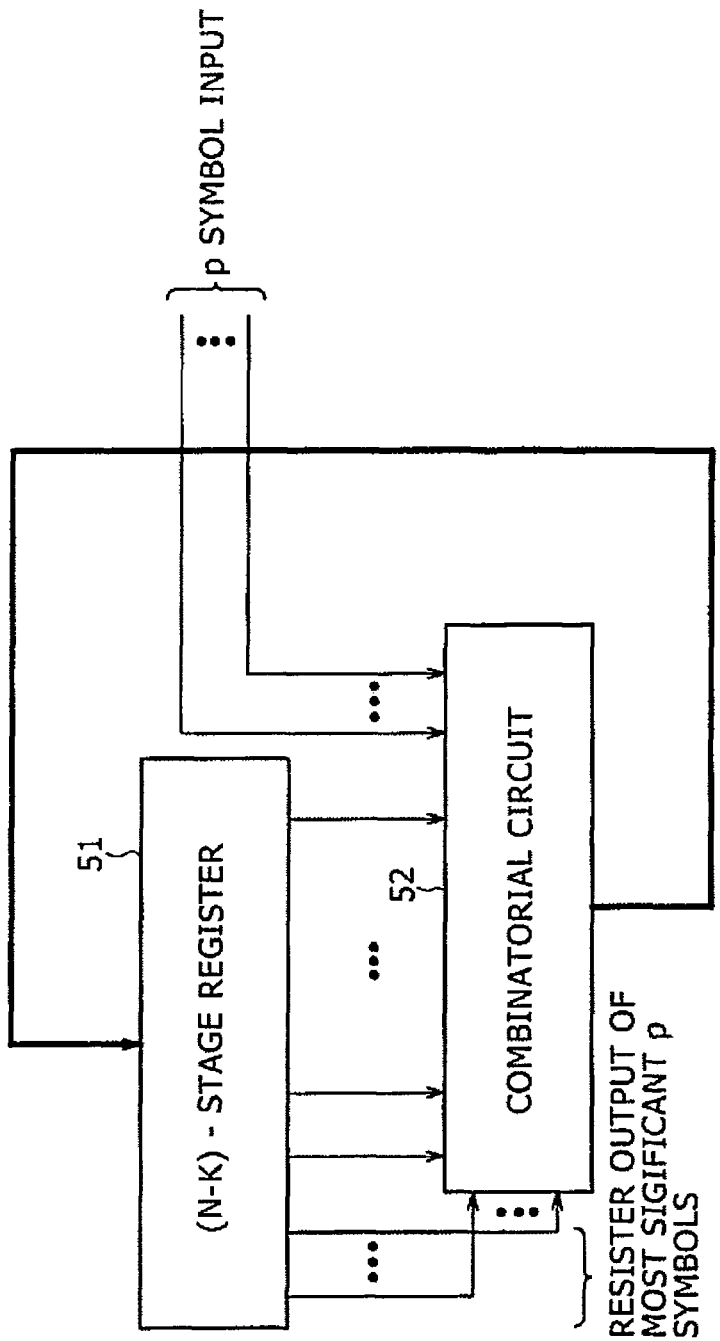
FIG. 3 is a circuit diagram illustrating an exemplary known configuration of a related-art parity generating circuit.
Figure 4:
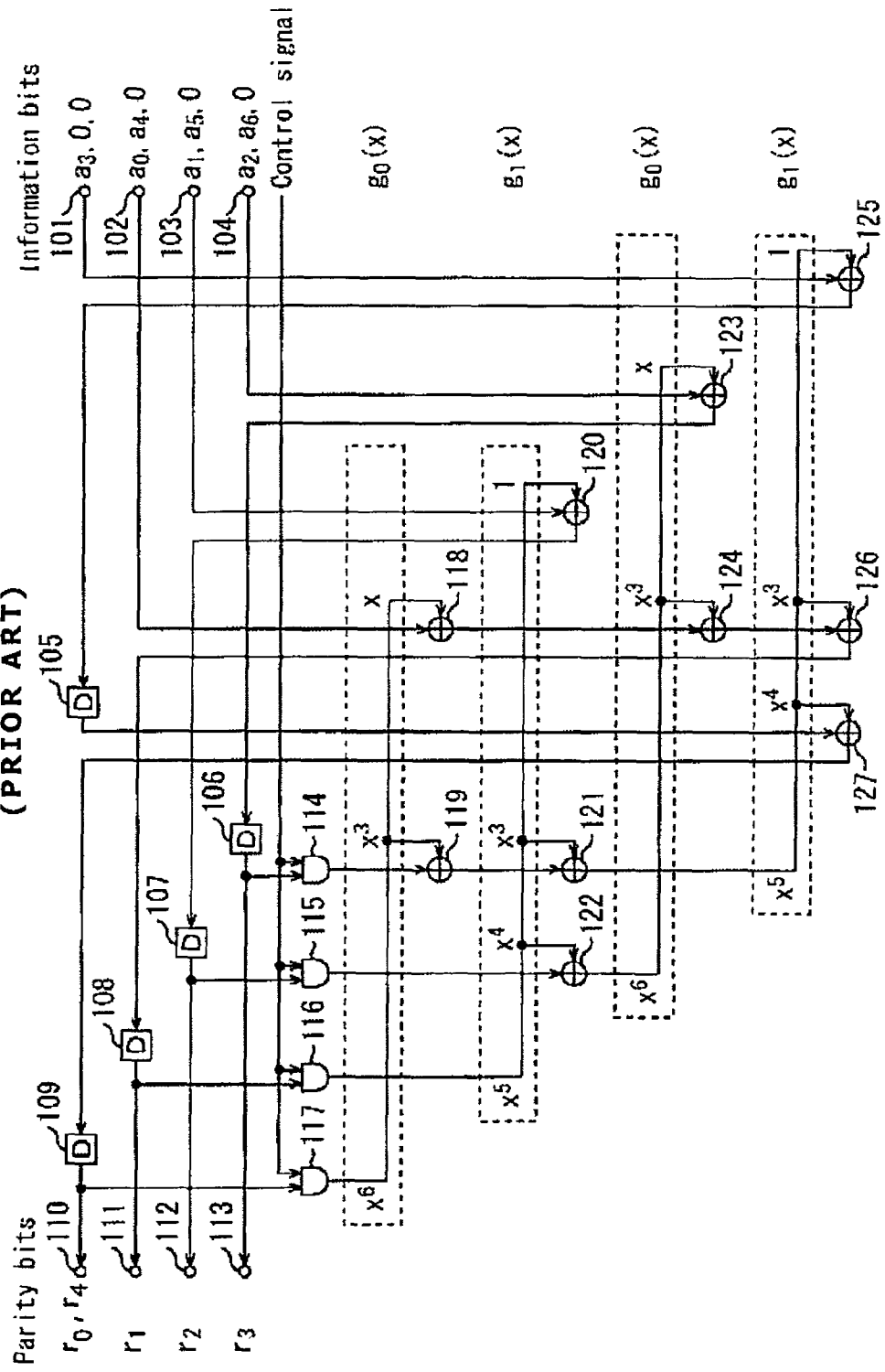
FIG. 4 is a circuit diagram illustrating an exemplary known configuration of a related-art parity generating circuit.
Figure 5:
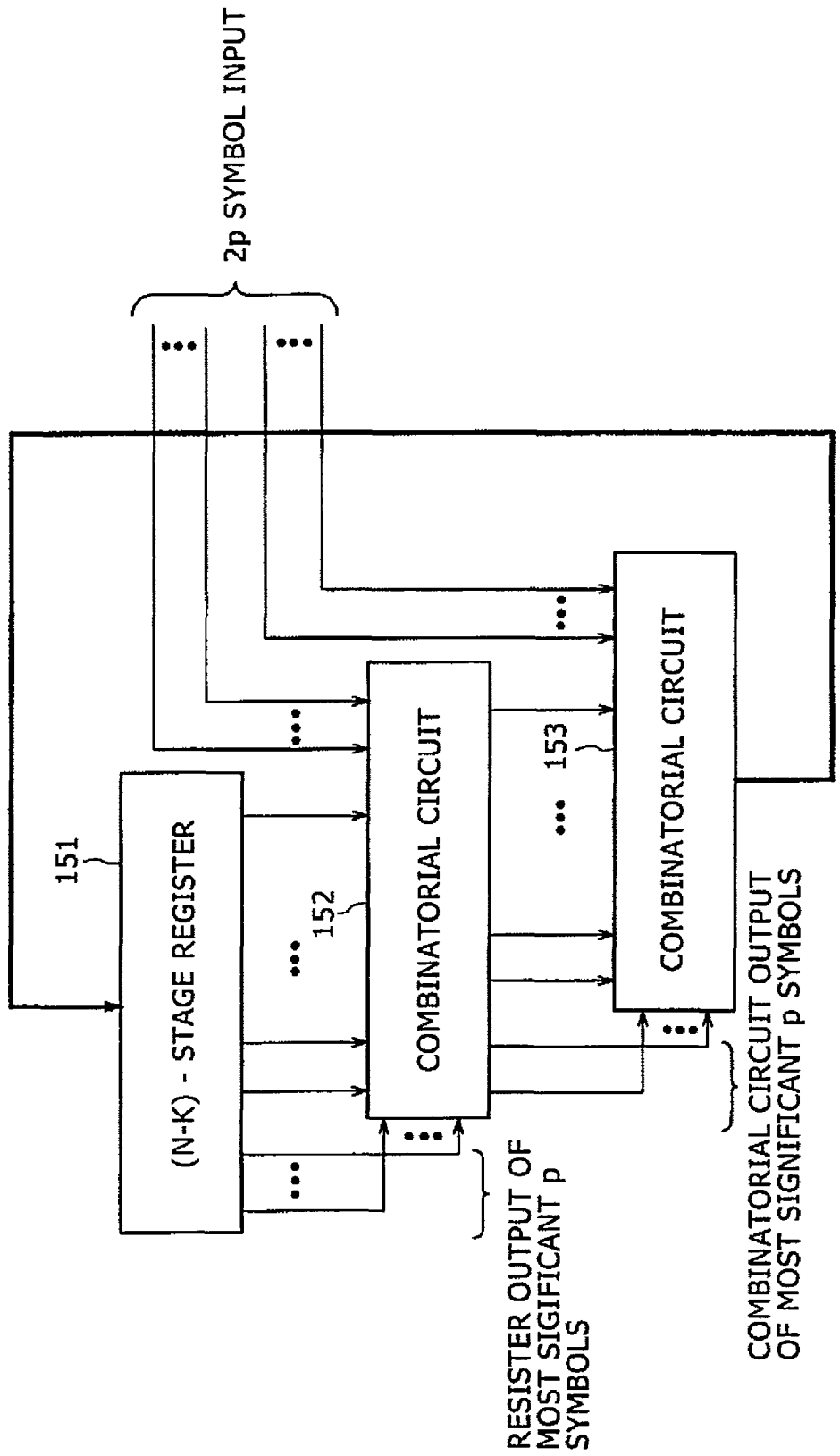
FIG. 5 is a circuit diagram illustrating an exemplary configuration of a known related-art parity generating circuit.
Figure 9:
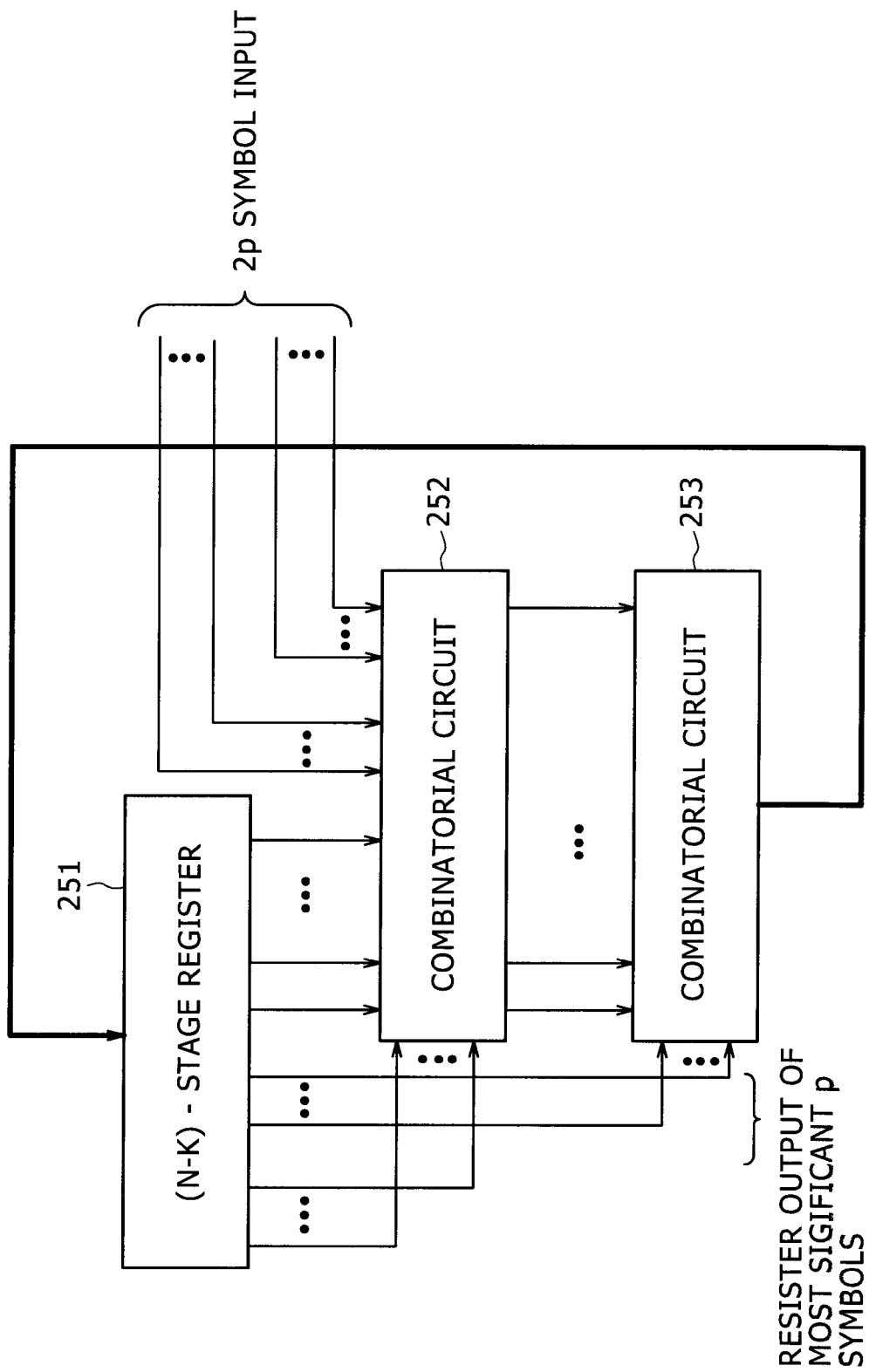
FIG. 9 is a circuit diagram illustrating an exemplary configuration of a parity generating circuit practiced as another embodiment of the invention.

FIG. 9 schematically shows a parity generating circuit configured to execute parallel processing on a 2p symbol basis by use of 2p generator polynomials. A parity generating circuit 250 shown in FIG. 9 is configured by an (N–K)-stage register 251, a combinatorial circuit 252, and a combinatorial circuit 253. For the purpose of contrasting with the parity generating circuit 150 shown in FIG. 5, a combinatorial circuit for executing operations by use of 2p generator polynomials is shown in the combinatorial circuit 252 and the combinatorial circuit 253, each executing p operations.

The combinatorial circuit 252 are entered with 2p symbols and the inputs from the (N–K)-stage register 251. The combinatorial circuit 252 is also entered with the register output of the most significant p symbol from the (N–K)-stage register 251. The combinatorial circuit 253 is entered with the output from the combinatorial circuit 252 and the register outputs of p symbols from the upper p+1 symbol to the 2p symbol from the (N–K)-stage register 251.

The combinatorial circuit 252 obtains coefficients of sequential $q_j(x^{2P})$ from the upper p symbols of the (N–K)-stage register 251, subtracts a value obtained by multiplying these p coefficients by a generator polynomial from a value made up of register outputs and new 2p information symbols, and outputs a result to the combinatorial circuit 253. The combinatorial circuit 253 obtains coefficients of sequential $q_j(x^{2P})$ from p symbols of the (N–K)-stage register 251 and subtracts a value obtained by multiplying these p coefficients by a generator polynomial from the output of the combinatorial circuit 252. Then, a result of this subtraction is outputted to the (N–K)-stage register 251 as a next register input value. Coefficients $q_j(x^{2P})$ for 2p symbols obtained from the (N–K)-stage register 251 are simultaneously obtained in both the combinatorial circuit 252 and the combinatorial circuit 253. Consequently, the multiplication between coefficient and generator polynomial can be simultaneously executed in both the combinatorial circuit 252 and the combinatorial circuit 253.

For example, because the coefficient for use in the multiplication with a generator polynomial in the combinatorial circuit 153 of the second stage in the related art is based on the operation result of the combinatorial circuit 152 of the first stage, the connection of the combinatorial circuits 152 and 153 resulted in a large delay. However, with the embodiment shown in FIG. 9, all the coefficients for use in the multiplication with generator polynomials can be simultaneously obtained from the register output, leading to a significant advantage of largely reduced delays.

As described above, in the embodiments of the present invention, a coding circuit based on mp generator polynomials is configured when parallel processing is executed in units of mp (a multiple of p) symbols. Then, each generator polynomial $g_j(x)$ is selected such that the coefficient of degree $deg(g_j(x))$ of x is made zero for all $g_j(x)$ lower in degree than that. This configuration reduces the circuit delay as compared with the connection of combinatorial circuits by p polynomials, thereby speeding up the coding processing.

Also, in the above-mentioned embodiments of the present invention, the description has been made by use of binary codes for example; in the case of other than binary codes, multiplication and subtraction are further included. For example, in the parity generating circuit 250 shown in FIG. 9, multiplication and subtraction are further executed in the combinatorial circuit 252 of the first stage and multiplication and subtraction are further executed in the combinatorial circuit 253 of the second stage. In these operations, the operations of the second stage are not executed on the basis of the results of the operations of the first stage, so that the occurrence of the delay due to the wait for an operation result in the first stage can be prevented. Consequently, in the case of codes other than binary codes, coding processing can be executed at speeds higher than those in the related-art technologies.

The present application contains subject matter related to that disclosed in Japanese Priority Patent Application JP 2008-217004 filed in the Japan Patent Office on Aug. 26, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A coding apparatus handling quasi-cyclic codes in which a given code word cyclically shifted by p symbols provides another code word, the apparatus comprising a circuit configured to generate parity bits for at least one of the quasi-cyclic codes, the circuit being further configured to:
   determine, based on register symbols, first coefficients corresponding to a register polynomial;
   obtain second coefficients corresponding to a predetermined number of generator polynomials, wherein:
      the predetermined number corresponds to an integer multiple of p, the integer exceeding unity;
      the generator polynomials are ordered in a corresponding sequence; and
      a degree of a first generator polynomial in the sequence exceeds a degree one or more second generator polynomials disposed at corresponding positions in the sequence below the first generator polynomial;
   compute (i) first values representative of corresponding information symbols and (ii) second values indicative of products of the first coefficients and corresponding ones of the second coefficients; and
   generate the parity bits based on differences between corresponding ones of the first and second values.

2. The coding apparatus of claim 1, further comprising a stage register configured to provide the register symbols to the circuit.

3. The coding apparatus of claim 1, wherein the circuit is further configured to obtain the second coefficients from a generator matrix.

4. The coding apparatus of claim 1, wherein the circuit is further configured to:
   obtain a parity check matrix associated with the at least one quasi-cyclic code;
   compute the generator matrix by executing a transpose of the parity check matrix, the generator matrix comprising a left-side matrix and a right-side matrix, the left-side matrix corresponding to a unit matrix.

5. The coding apparatus of claim 1, wherein the parity bits correspond to coefficients of a parity polynomial.

6. A coding method for a coding apparatus handling quasi-cyclic codes in which a given code word cyclically shifted by p symbols provides another code word, comprising:
   determining, based on register symbols, first coefficients corresponding to a register polynomial;
   obtaining second coefficients corresponding to a predetermined number of generator polynomials, wherein:
      the predetermined number corresponds to an integer multiple of p, the integer exceeding unity;
      the generator polynomials are ordered in a corresponding sequence; and
      a degree of a first generator polynomial in the sequence exceeds a degree one or more second generator polynomials disposed at corresponding positions in the sequence below the first generator polynomial;
   computing (i) first values representative of corresponding information symbols and (ii) second values indicative of products of the first coefficients and corresponding ones of the second coefficients; and
   generating parity bits for at least one of the quasi-cyclic codes based on differences between corresponding ones of the first and second values.

7. A coding apparatus, comprising:
   an (N, K) stage register comprising a quasi-cyclic code in which a given code word cyclically shifted by p symbols provides another code word; and
   first and second combination circuits, the first and second combination circuits providing parallel processing of a predetermined number of generator polynomials, wherein:
      the predetermined number corresponds to an integer multiple of p, the integer exceeding unity;
      the generator polynomials are ordered in a corresponding sequence; and
      a degree of a first generator polynomial in the sequence exceeds a degree one or more second generator polynomials disposed at corresponding positions in the sequence below the first generator polynomial;
      the first combination circuit comprises a symbol input capable of receiving first register symbols from the (N, K) stage register and information symbols;
      the second combination circuit is configured to receive a first an output of the first combination circuit and second register symbols from the (N, K) stage register; and
      a second output of the second combination circuit is provided to the (N, K) stage register as an input value.

8. The coding apparatus of claim 7, wherein:
   the symbol input of the first combination circuit is configured to receive, in parallel, a number of information symbols corresponding to the integer product of m and p;
   the first register symbols comprise an lower portion of a plurality of sequential register symbols provided by the (N, K) stage register; and
   the second register symbols comprise an upper portion of the sequential register symbols provided by the (N, K) stage register.

9. The coding apparatus of claim 7, wherein the first combination circuit is configured to:
   determine, based on the first register symbols, first coefficients corresponding to a register polynomial;
   obtain second coefficients corresponding to the generator polynomials;
   compute (i) first values representative of corresponding information symbols and (ii) second values indicative of products of the first coefficients and corresponding ones of the second coefficients; and
   generate the first output based on differences between corresponding ones of the first and second values.

10. The coding apparatus of claim 9, wherein the second combination circuit is configured to:
   determine, based on the second register symbols, third coefficients corresponding to the register polynomial;
   obtain fourth coefficients corresponding to the generator polynomials;
   compute (i) third values representative of the first output and (ii) fourth values indicative of products of the third coefficients and corresponding ones of the fourth coefficients; and
   generate the second output based on differences between corresponding ones of the third and fourth values.

11. The coding apparatus of claim 7, wherein:
   the first combination circuit is further configured to obtain the second coefficients from a first generator matrix; and
   the second combination circuit is further configured to obtain the second coefficients from a second generator matrix.

12. A coding apparatus comprising:
   an (N, K) stage register comprising a quasi-cyclic code in which a given code word cyclically shifted by p symbols provides another code word; and
   a plurality of combination circuits that provide parallel processing of a predetermined number of generator polynomials, wherein:
      the plurality of combination circuits comprises m combination circuits, m being an integer greater than 2, and the predetermined number comprises a product of m and p;
      the generator polynomials are ordered in a corresponding sequence; and
      a degree of a first generator polynomial in the sequence exceeds a degree one or more second generator polynomials disposed at corresponding positions in the sequence below the first generator polynomial;
      a first one of the m combination circuits comprises a symbol input capable of receiving first register symbols from the (N, K) stage register and information symbols;
      successive ones of the m combination circuits are configured to receive a first output of a previous combination circuit and second register symbols from the (N, K) stage register; and
      a second output of an $m^{th}$ one of the successive combination circuits is provided to the (N, K) stage register as an input value.

13. The coding apparatus of claim 12, wherein:
   the symbol input of the first combination circuit is configured to receive, in parallel, a number of information symbols corresponding to the product of m and p;
   the first register symbols comprise an lower portion of a plurality of sequential register symbols provided by the (N, K) stage register; and
   the second register symbols comprise an upper portion of the sequential register symbols provided by the (N, K) stage register.

14. The coding apparatus of claim 12, wherein the first one of the combination circuits is configured to:
   determine, based on the first register symbols, first coefficients corresponding to a register polynomial;

obtain second coefficients corresponding to the generator polynomials;

compute (i) first values representative of corresponding information symbols and (ii) second values indicative of products of the first coefficients and corresponding ones of the second coefficients; and generate the first output based on differences between corresponding ones of the first and second values.

15. The coding apparatus of claim 14, wherein the successive ones of the combination circuit are configured to:

determine, based on the second register symbols, third coefficients corresponding to the register polynomial;

obtain fourth coefficients corresponding to the generator polynomials;

compute (i) third values representative of the first output and (ii) fourth values indicative of products of the third coefficients and corresponding ones of the fourth coefficients; and generate the second output based on differences between corresponding ones of the third and fourth values.

16. The coding apparatus of claim 12, wherein:

the first one of the combination circuits is further configured to obtain the second coefficients from a first generator matrix; and the successive ones of the combination circuits are further configured to obtain the second coefficients from a second generator matrix.

17. A coding method, comprising:

generating an instruction to load, into an (N, K) stage register, a quasi-cyclic code in which a given code word cyclically shifted by p symbols provides another code word; and processing a predetermined number of generator polynomials in parallel using first and second combination circuits, wherein:

the predetermined number corresponds to an integer multiple of p, the integer exceeding unity;

the generator polynomials are ordered in a corresponding sequence; and a degree of a first generator polynomial in the sequence exceeds a degree one or more second generator polynomials disposed at corresponding positions in the sequence below the first generator polynomial;

the first combination circuit comprises a symbol input capable of receiving first register symbols from the (N, K) stage register and information symbols; and the second combination circuit is configured to receive a first output of the first combination circuit and second register symbols from the (N, K) stage register, and generating an instruction to provide a second output of the second combination circuit to the (N, K) stage register as an input value.

18. A coding method, comprising:

generating an instruction to load, into an (N, K) stage register, a quasi-cyclic code in which a given code word cyclically shifted by p symbols provides another code word; and processing a predetermined number of generator polynomials in parallel using a plurality of combination circuits, wherein:

the plurality of combination circuits comprises m combination circuits, m being an integer greater than 2, and the predetermined number comprises a product of m and p;

the generator polynomials are ordered in a corresponding sequence;

a degree of a first generator polynomial in the sequence exceeds a degree one or more second generator polynomials disposed at corresponding positions in the sequence below the first generator polynomial;

a first one of the m combination circuits comprises a symbol input capable of receiving first register symbols from the (N, K) stage register and information symbols; and successive ones of the m combination circuits are configured to receive a first output of a previous combination circuit and second register symbols from the (N, K) stage register; and generating an instruction to supply a second output of an $m^{th}$ one of the combination circuits to the (N, K) stage register as an input value.

* * * * *